United States Patent
Lee et al.

(10) Patent No.: US 8,665,655 B2
(45) Date of Patent: Mar. 4, 2014

(54) NON-VOLATILE MEMORY DEVICE AND SENSING METHOD THEREOF

(75) Inventors: Hyun Joo Lee, Yongin-si (KR); Sung Yeon Lee, Seoul (KR)

(73) Assignee: Hynix Semiconductor Inc., Icheon (KR)

(*) Notice: Subject to any disclaimer, the term of this patent is extended or adjusted under 35 U.S.C. 154(b) by 190 days.

(21) Appl. No.: 13/240,681

(22) Filed: Sep. 22, 2011

(65) Prior Publication Data

US 2012/0140574 A1    Jun. 7, 2012

(30) Foreign Application Priority Data

Dec. 7, 2010    (KR) .................. 10-2010-0124533

(51) Int. Cl.
*G11C 7/06* (2006.01)
(52) U.S. Cl.
USPC ............ 365/189.07; 365/189.06; 365/189.08; 365/189.15
(58) Field of Classification Search
USPC ............. 365/189.07, 189.08, 189.06, 189.15, 365/171, 173
See application file for complete search history.

(56) References Cited

U.S. PATENT DOCUMENTS

| | | | |
|---|---|---|---|
| 8,385,103 B2* | 2/2013 | Yun | 365/148 |
| 2009/0097336 A1* | 4/2009 | Kang et al. | 365/189.14 |
| 2009/0285016 A1* | 11/2009 | Bedeschi et al. | 365/163 |
| 2010/0220519 A1* | 9/2010 | Kim | 365/163 |

FOREIGN PATENT DOCUMENTS

| | | |
|---|---|---|
| KR | 10-2000-0045330 A | 7/2000 |
| KR | 10-2001-0105275 A | 11/2001 |

* cited by examiner

*Primary Examiner* — Richard Elms
*Assistant Examiner* — Hien Nguyen (57) ABSTRACT

A non-volatile memory device is disclosed, which performs a sensing operation using a current. The non-volatile memory device includes a cell array including one or more unit cells, configured to read or write data, a current-voltage converter configured to convert a sensing current corresponding to data stored in the unit cell into a sensing voltage, and perform a precharge operation of the sensing voltage upon receiving the sensing current in response to a current driving signal at an activation time point of a word line of the cell array, and a sense-amp configured to compare the sensing voltage with a predetermined reference voltage, and amplify the compared result.

14 Claims, 10 Drawing Sheets

NON-VOLATILE MEMORY DEVICE AND SENSING METHOD THEREOF

CROSS-REFERENCE TO RELATED APPLICATION

The priority of Korean patent application No. 10-2010-0124533 filed on Dec. 7, 2010, the disclosure of which is hereby incorporated in its entirety by reference, is claimed.

BACKGROUND OF THE INVENTION

Embodiments of the present invention relate to a non-volatile memory device and a sensing method thereof, and more specifically, to a non-volatile memory device configured to sense multi-level data using resistance variation.

Memory devices can be classified into volatile memory devices and non-volatile memory devices. The non-volatile memory device includes a non-volatile memory cell capable of preserving stored data even when not powered. For example, the non-volatile memory device may be implemented as a flash random access memory (flash RAM), a phase change random access memory (PCRAM), or the like.

The PCRAM includes a memory cell that is implemented using a phase change material such as germanium antimony tellurium (GST), wherein the GST changes to a crystalline phase or an amorphous phase if heat is applied to the GST, thereby storing data in the memory cell.

A non-volatile memory device (e.g., a magnetic memory, a phase change memory (PCM), or the like) has a data processing speed similar to that of a volatile RAM device. The non-volatile memory device also preserves data even when power is turned off.

Figure 1A:
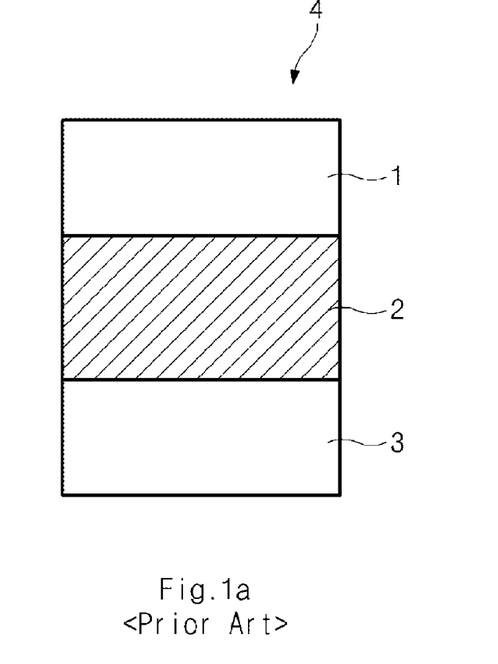
FIGS. 1A and 1B illustrate a conventional phase change resistor (PCR) element.
Figure 1B:
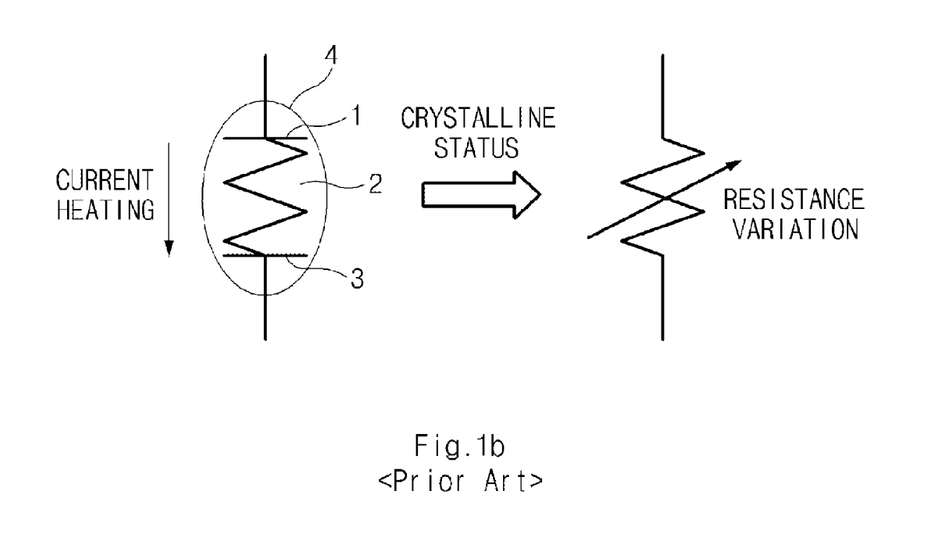

FIGS. 1A and 1B illustrate a conventional phase change resistor (PCR) element 4.

Referring to FIGS. 1A and 1B, the PCR element 4 includes a top electrode 1, a bottom electrode 3, and a phase change material (PCM) layer 2 located between the top electrode 1 and the bottom electrode 3. If a voltage and a current are applied to the top electrode 1 and the bottom electrode 3, a current signal is provide to the PCM layer 2, and a high temperature is induced in the PCM layer 2, such that an electrical conductive status of the PCM layer 2 changes depending on the resistance.

Figure 2A:
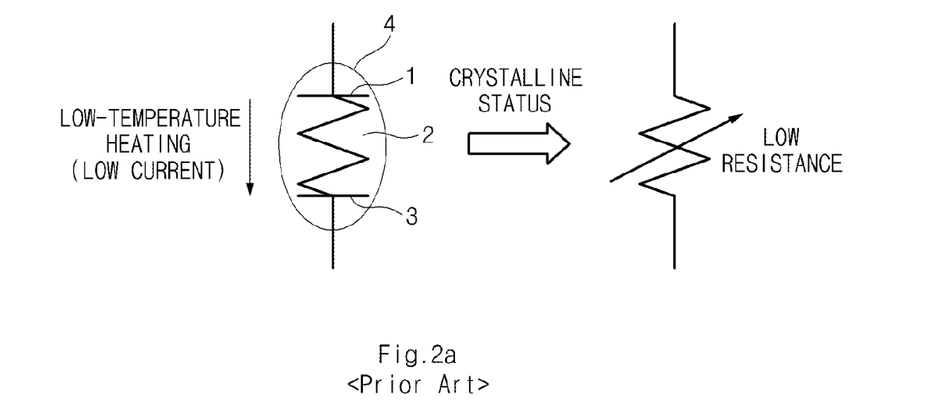
FIGS. 2A and 2B illustrate the principles of data storage in a conventional PCR element.
Figure 2B:
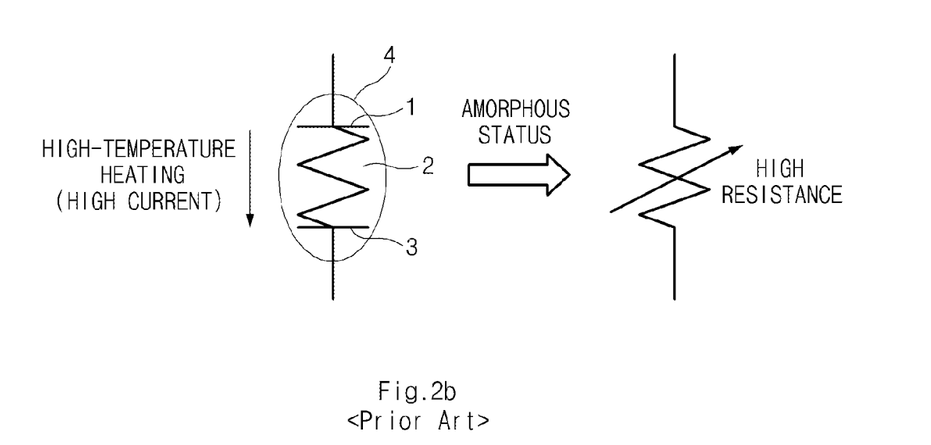

FIGS. 2A and 2B illustrate a phase change principle of the conventional PCR element 4.

Referring to FIG. 2A, if a low current smaller than a threshold value flows in the PCR element 4, the PCM layer 2 has a temperature suitable for a crystalline phase. Therefore, the PCM layer 2 changes to the crystalline phase, which is a low-resistance phase material. As a result, a current may flow between the top electrode 1 and the bottom electrode 3.

On the other hand, as shown in FIG. 2B, if a high current greater than the threshold value flows in the PCR element 4, the PCM layer 2 has a temperature higher than a melting point. Therefore, the PCM layer 2 changes to an amorphous phase, which is a high-resistance phase material. As a result, it is difficult for the current to flow between the top electrode 1 and the bottom electrode 3.

As described above, the PCR element 4 can store data corresponding to two resistance phases as non-volatile data. For example, if the PCR element 4 has a low-resistance phase set to data '1' and the PCR element 4 has a high-resistance phase set to data '0', the PCR element 4 may store two logic states for data.

In addition, a phase of the PCM layer (i.e., a phase change resistive material) 2 is not changed although the phase change memory device is powered off, such that the aforementioned data can be stored as non-volatile data.

Figure 3:
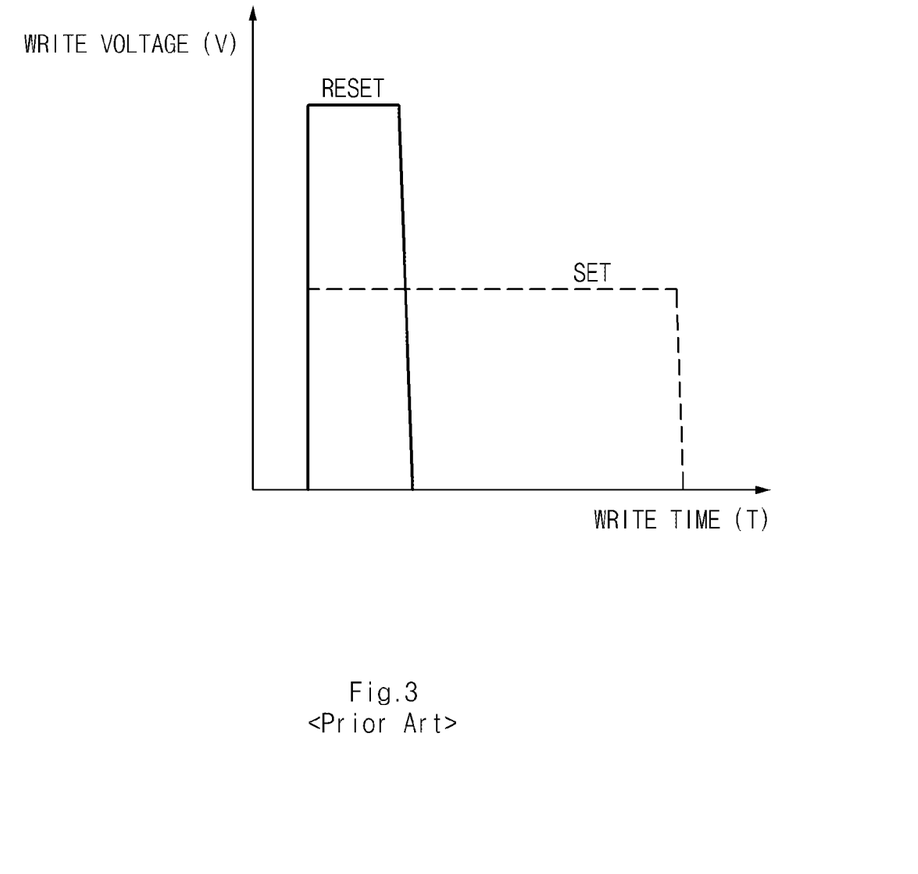
FIG. 3 illustrates a write operation of a Phase Change Resistor (PCR) cell according to the related art.

FIG. 3 illustrates a write operation of a conventional Phase Change Resistor (PCR) cell.

Referring to FIG. 3, when a current flows between the top electrode 1 and the bottom electrode 3 of the PCR element 4 for a predetermined time, heat is generated.

Assuming that a low current smaller than a threshold value flows in the PCR element 4 during the predetermined time, the PCM layer 2 has the crystalline phase formed by a low-temperature heating state, such that the PCR element 4 becomes a low-resistance element having a set state.

Otherwise, assuming that a high current greater than the threshold value flows in the PCR element 4 during the predetermined time, the PCM layer 2 has the amorphous phase formed by a high-temperature heating state, such that the PCR element 4 becomes a high-resistance element having a reset state.

By means of the aforementioned properties, in order to write data of the set state during the write operation, a low voltage is applied to the PCR element 4 for a long period of time. On the other hand, in order to write data of the reset state during the write operation, a high voltage is input to the PCR element 4 for a short period of time.

The PCR memory device outputs a sensing current to the PCR element 4 during a sensing operation, such that it can sense data written in the PCR element 4.

Figure 4:
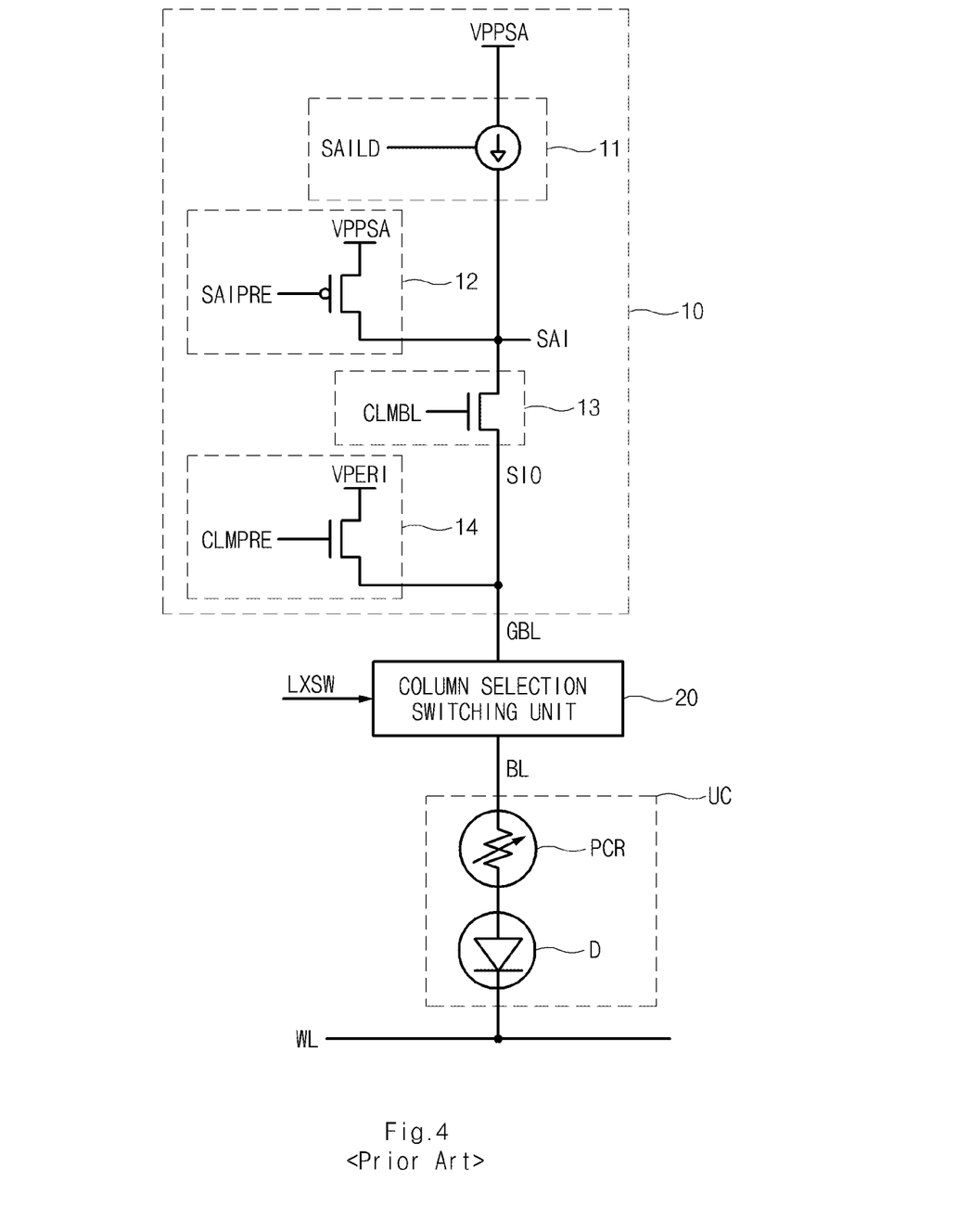
FIG. 4 is a detailed block diagram illustrating a phase change memory device according to the related art.

FIG. 4 is a detailed block diagram illustrating a current-to-voltage converter (hereinafter referred to as a current-voltage converter) of a phase change memory device according to the related art.

Referring to FIG. 4, the current-voltage converter includes a driving unit 11, a precharge unit 12, a clamping unit 13, and a clamping precharge unit 14.

A unit cell UC includes a phase change resistor (PCR) element and a diode D.

The column selection switching unit 20 selects one of a plurality of bit lines BL in response to the column selection signal LXSW. The bit line BL selected by the column selection signal LXSW is connected to a global bit line GBL.

The driving unit 11 drives a high voltage VPPSA in response to a current driving signal SAILD, such that it outputs a sensing voltage SAI.

The precharge unit 12 precharges the sensing voltage SAI with a high voltage (VPPSA) level in response to the precharge signal SAIPRE.

The clamping unit 13 clamps a voltage level of the sensing voltage SAI in response to a clamping control signal CLMBL during a sensing operation.

The clamping precharge unit 14 percharges a node SIO with a peri-voltage (VPERI) level in response to a clamping precharge signal CLMPRE.

Figure 5:
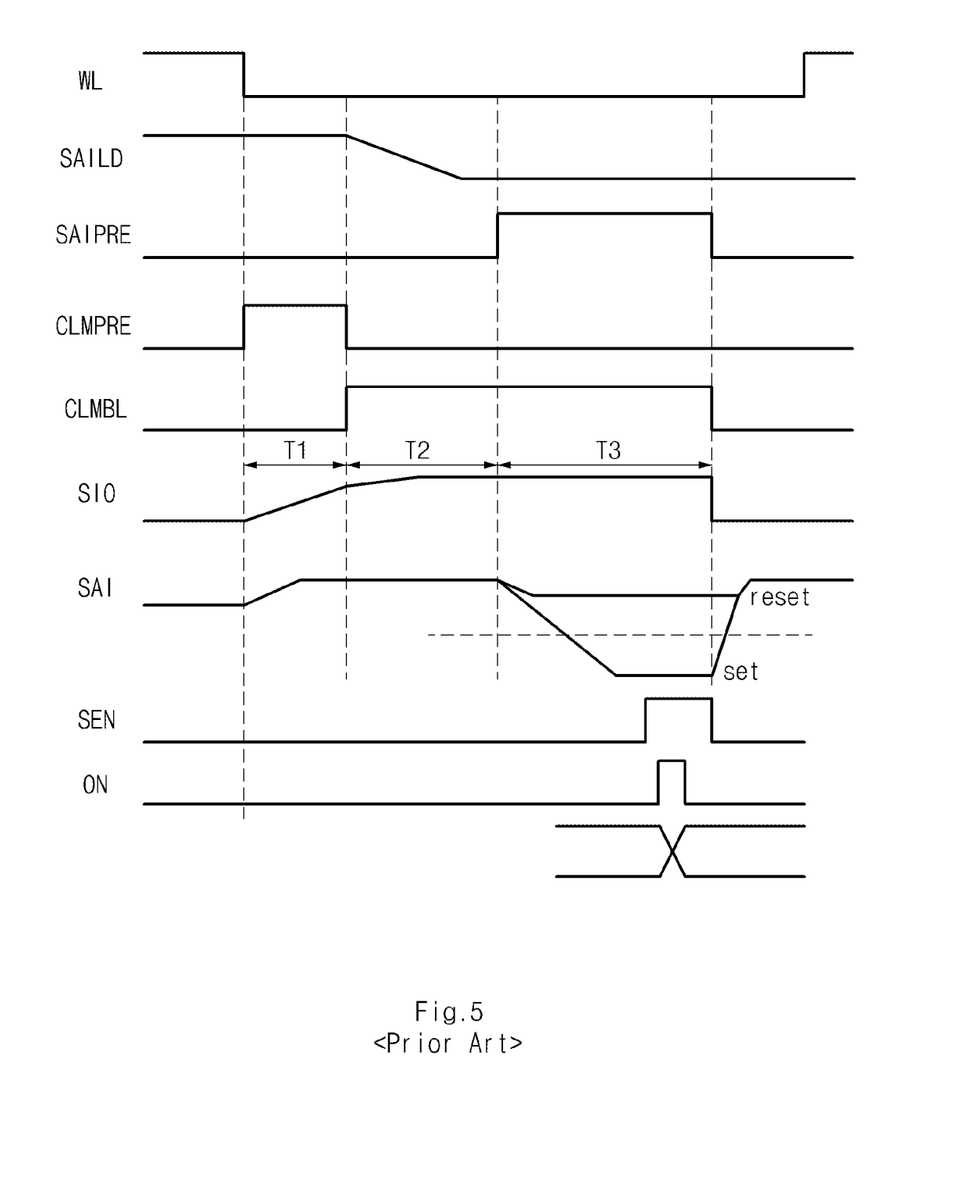
FIG. 5 is an operation timing diagram illustrating operations of the phase change memory device shown in FIG. 4.

FIG. 5 is an operation timing diagram illustrating operations of the phase change memory device shown in FIG. 4.

Referring to FIG. 5, the clamping control signal CLMBL is activated to a high level during the T1 period. Therefore, the clamping precharge unit 14 is turned on such that the node SIO is precharged with a peri-voltage (VPERI) level.

Thereafter, a current driving signal SAILD goes to a low level during the T2 period, such that the driving unit 11 is turned on. Since the driving unit 11 is turned on, the node SIO is increased to a high voltage (VPPSA) level. The clamping control signal CLMBL goes to a high level such that the clamping unit 13 is turned on. Thus, the node SIO outputs the sensing voltage SAI.

After that, during the T3 period, the precharge signal SAIPRE is deactivated to a high level such that the developing operation of data is achieved. If the precharge signal SAIPRE is deactivated to a high level, the precharge operation is ended and the sensing operation starts.

In this case, during the T1 or T2 period before the beginning of the sensing operation, the precharge signal SAIPRE is activated to a low level such that the sensing voltage SAI is precharged with a high voltage (VPPSA) level.

However, the conventional phase change memory device for performing the above-mentioned operations including the driving unit 11 further includes a precharge unit for precharging the sensing voltage SAI prior to the sensing operation. As a result, the area of the current-voltage converter of the phase change memory device is unavoidably increased.

BRIEF SUMMARY OF THE INVENTION

Various embodiments of the present invention are directed to providing a non-volatile memory device that substantially obviates one or more problems due to limitations and disadvantages of the related art.

Embodiments of the present invention relate to a non-volatile memory device that, when reading data of a non-volatile memory device that senses a variation of voltage changing with a cell resistance and amplifies the sensed result to a voltage level, reduces the area of a sense-amp array by adjusting a timing point of the precharge operation used for sensing.

In accordance with one embodiment of the present invention, a non-volatile memory device includes a cell array including one or more unit cells, configured to read or write data; a current-voltage converter configured to convert a sensing current corresponding to data stored in the unit cell into a sensing voltage, and to precharge the sensing voltage upon receiving the sensing current in response to a current driving signal at an activation time point of a word line of the cell array; and a sense-amp configured to compare the sensing voltage with a predetermined reference voltage, and to amplify the compared result.

In accordance with another embodiment of the present invention, a non-volatile memory device includes a cell array including one or more unit cells, configured to read or write data; a current-voltage converter configured to convert a sensing current corresponding to data stored in the unit cell into a sensing voltage, and to precharge the sensing voltage upon receiving the sensing current in response to a plurality of current driving signals at an activation time point of a word line of the cell array; and a sense-amp configured to compare the sensing voltage with a predetermined reference voltage, and to amplify the compared signal.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to embodiments of the present invention, examples of which are illustrated in the accompanying drawings. Wherever possible, the same reference numbers will be used throughout the drawings to refer to the same or like parts.

Figure 6:
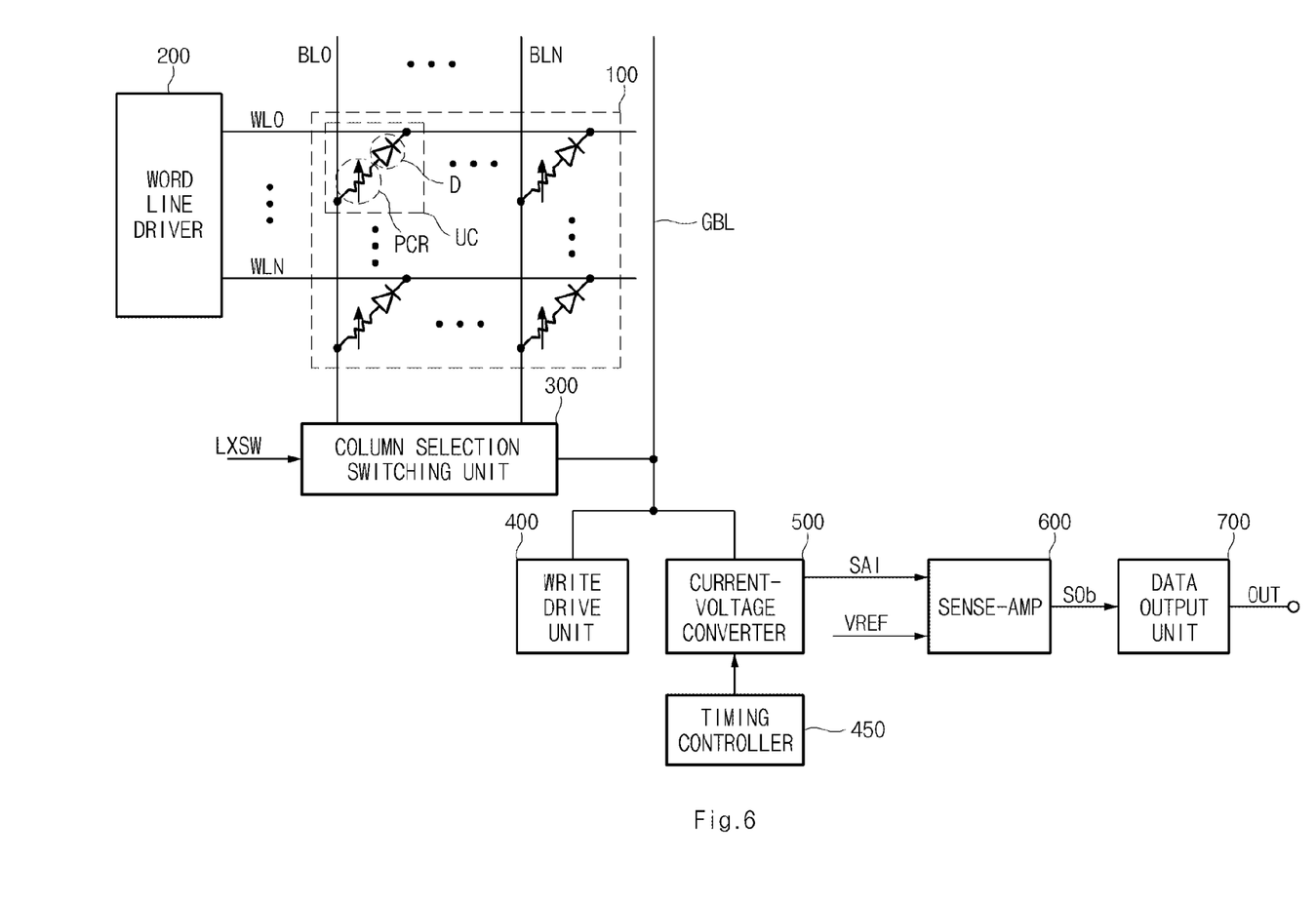
FIG. 6 is a block diagram illustrating a non-volatile memory device according to an embodiment of the present invention.

FIG. 6 is a block diagram illustrating a non-volatile memory device according to an embodiment of the present invention.

Referring to FIG. 6, the non-volatile memory device according to one embodiment of the present invention includes a cell array 100, a word line driver 200, a column selection switching unit 300, a write driver 400, a timing controller 450, a current-voltage converter 500, a sense amplifier (sense-amp) 600, and a data output unit 700.

The cell array 100 includes a plurality of unit cells (UCs), and detects a resistance value of each unit cell UC using a current variation. The unit cell UC is formed at an intersection area between the bit line BL and the word line WL. Each unit cell (UC) includes a memory device, and stores data in the memory device.

Herein, the memory element may be any one of various non-volatile memory elements, for example, a ferroelectric capacitor, a phase change memory element, a Spin Torque Transfer (STT) element, a magneto-resistive element, and the like.

In accordance with the present embodiment, each unit cell (UC) contained in the cell array 100 may include a phase change resistor (PCR) element.

For example, as shown in FIG. 6, a non-volatile memory device is a phase change resistor (PCR), and a switching element is a diode D for convenience of description and better understanding of the present invention. Generally, a diode type beneficial to the cell area may be used as the non-volatile memory device. However, the present invention is not limited to such structures, and may include other structures in other embodiments.

The PCR is connected between the bit line BL and the diode D such that it stores data therein. A resistance value of the PCR can be changed to change the stored data.

The switching element may be set to a diode D capable of reducing a cell area. The diode D is connected between the phase change resistor (PCR) and the word line WL. The diode D enables a current to flow in a forward direction, and prevents the current from flowing in a reverse direction. In the phase change memory device according to the embodiment of the present invention, the direction from the bit line BL to the word line WL may be set to the forward direction as an example.

The cell array 100 is connected to the column selection switching unit 300 through bit lines BL0~BLN, and is connected to the word line driver 200 through word lines WL0~WLN.

When the word line driver 200 performs the sensing operation for one or more unit cells (UCs), the word line WL connected to the corresponding unit cell (UC) is activated. The word line driver 200 provides a low-level voltage to the word line WL so as to activate the word line WL.

For example, provided that the sensing operation for the unit cell UC connected to the word line WL0 is performed, the word line driver 200 activates the word line WL0 and deactivates other word lines WL1~WLN.

The column selection switching unit 300 selects one of the plurality of bit lines BL0~BLN in response to the column selection signal LXSW. The bit line BL selected by a column selection signal LXSW is connected to a global bit line GBL.

The write driver 400 generates a driving voltage corresponding to input data during the write operation, and outputs the driving voltage to the cell array 100 through the global bit line GBL and the column selection switching unit 300.

If the word line driver 200 drives the word line WL at a low-level voltage, the write driver 400 outputs the driving voltage to the unit cell (UC) through the bit lines BL0~BLN. In this case, because the bit line BL has a voltage level higher than that of the word line WL, a forward current flows in the switching element contained in the unit cell (UC).

As a result, a current flows in the PCR and a voltage proportional to a resistance value is applied to both ends of the PCR. The current-voltage converter 500 and the sense-amp 600 sense the value of a current applied to both ends of the PCR, thereby generating a sensing voltage (SAI).

In this case, when a forward current flows in the PCR, the value of a current passing through the PCR is changed in inverse proportion to a resistance of the PCR.

The timing controller 450 outputs a control signal for controlling the current-voltage converter 500 and the precharge timing.

The current-voltage converter 500 converts a cell-sensing current flowing in the global bit line GBL into a voltage, such that it outputs a sensing voltage SAI. The non-volatile memory device for sensing data by reading a current variation requires the current-voltage converter 500.

The sense-amp 600 compares the sensing voltage SAI to a reference voltage VREF, amplifies a difference between the sensing voltage SAI and the reference voltage VREF, and thus outputs sensing data (SOb). In the embodiment of the present invention, the current-voltage converter 500 and the sense-amp 600 are generally named a sense-amp array.

The data output unit 700 stores sensing data (SOb) generated from the sense-amp 600 during a predetermined period of time, and then outputs an output signal OUT.

For example, the data output unit 700 may include a latch circuit. In this case, the sensing data (SOb) output from the sense-amp 600 is latched in the latch circuit for a predetermined period of time, and is then output.

Figure 7:
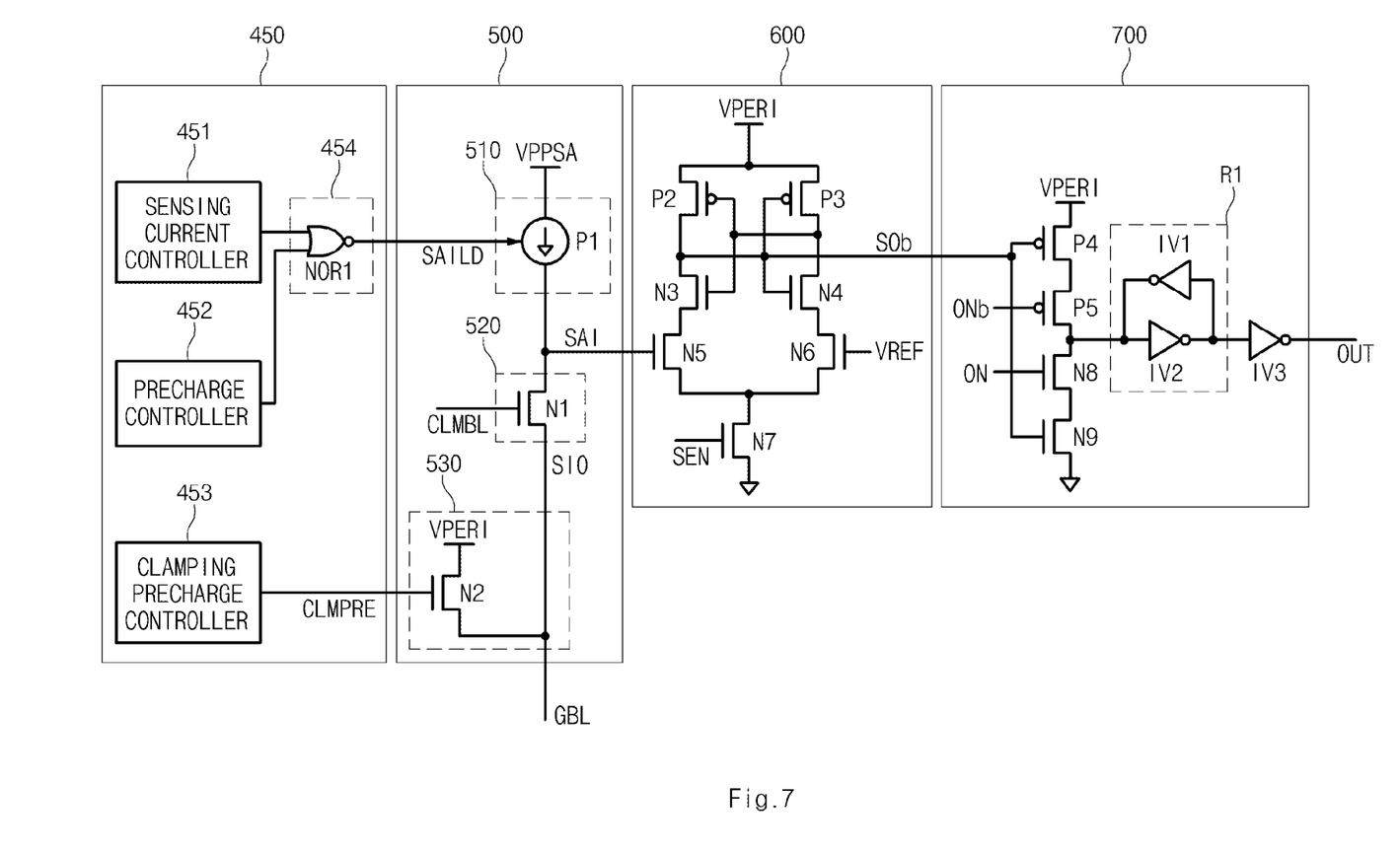
FIG. 7 is a detailed circuit diagram illustrating the non-volatile memory device shown in FIG. 6.

FIG. 7 is a detailed circuit diagram illustrating the non-volatile memory device shown in FIG. 6.

Referring to FIG. 7, the timing controller 450 includes a sensing-current controller 451, a precharge controller 452, a clamping precharge controller 453, and a combination unit 454.

Herein, the sensing-current controller 451 controls the sensing current flowing in the current-voltage converter 500.

In this case, the precharge controller 452 controls the activation timing of the current driving signal SAILD during the precharge operation. For example, when the word line WL is activated to a low level, the precharge controller 452 activates the current driving signal SAILD to a low level and then outputs the activated result.

The clamping precharge controller 453 controls the activation timing of the clamping precharge signal CLMPRE during the precharge operation. For example, when the word line WL is activated to a low level, the clamping precharge controller 453 activates the clamping precharge signal CLMPRE to a high level and then outputs the activated result.

In addition, the combination unit 454 logically combines the output signal of the sensing current controller 451 and the output signal of the precharge controller 452. If any one of the output signal of the sensing current controller 451 and the output signal of the precharge controller 452 is activated to a high level, the combination unit 454 outputs a low-level current driving signal SAILD.

In this case, the combination unit 454 includes a NOR gate NOR1 that performs a NOR operation of the output signals of the sensing current controller 451 and the precharge controller 452 so as to output the current driving signal SAILD.

In addition, the current-voltage converter 500 includes a drive unit 510, a clamping unit 520, and a clamping precharge unit 530.

The drive unit 510 outputs the sensing voltage SAI by driving a high voltage VPPSA in response to the current driving signal SAILD. The drive unit 510 includes a current driving transistor P1 that is connected between a high voltage (VPPSA) input terminal and a sensing voltage (SAI) output terminal so as to receive the current driving signal SAILD through a gate terminal.

In this case, the current driving transistor P1 may be implemented as a PMOS transistor. The drive unit 510 may adjust the amount of the sensing current flowing in the PMOS transistor P1 in response to the current driving signal SAILD, thereby controlling the sensing voltage SAI. The current driving signal SAILD is input to a low level during the sensing operation, or is input to a high level during operations other than the sensing operation.

In addition, if a diode-type switching element is used in the unit cell (UC), a high voltage is required for the read operation due to a high threshold voltage of the diode. For this operation, the current-voltage converter 500 is designed to use a high voltage VPPSA higher than a peri-voltage VPERI used in the read operation. The peri-voltage VPERI is a voltage level used in a general peripheral circuit, and is set to a general external voltage level. Accordingly, the sensing voltage SAI is driven at a high voltage (VPPSA) level higher than the peri-voltage (VPERI).

In addition, the clamping unit 520 clamps a voltage level of the sensing voltage SAI received from the global bit line GBL in response to the clamping control signal CLMBL during the sensing operation. The clamping unit 520 includes an NMOS transistor N1 that is connected between the sensing voltage (SAI) output terminal and the node SIO so as to receive the clamping control signal CLMBL through a gate terminal.

For example, during the sensing operation, if a high-level clamping control signal CLMBL is input, the NMOS transistor N1 is turned on, such that the sensing voltage (SAI) level received from the global bit line GBL is clamped. Conversely, if the sensing operation is not performed and a low-level clamping control signal CLMBL is input, the NMOS transistor N1 is turned off such that no sensing voltage SAI is output.

The clamping precharge unit 530 may precharge the node SIO with the peri-voltage (VPERI) level in response to the clamping precharge signal (CLMPRE). In this case, the clamping precharge unit 530 includes an NMOS transistor N2 that is connected between the peri-voltage (VPERI) input terminal and the node SIO so as to receive the clamping precharge signal (CLMPRE) through a gate terminal.

The sense-amp 600 includes PMOS transistors P2 and P3 and NMOS transistors N3~N7. In this case, the PMOS transistors P2 and P3 and the NMOS transistors N3 and N4 are cross-coupled to one another, and are driven at the peri-voltage (VPERI) level.

The sensing voltage SAI is input to a gate terminal of the NMOS transistor N5, and the reference voltage VREF is input to a gate terminal of the NMOS transistor N6. The sense-amp 600 compares the sensing voltage SAI with the reference voltage VREF, and amplifies the compared result. The NMOS transistor N7 is connected between a common source terminal of the NMOS transistors N5 and N6 and a ground voltage terminal, such that it receives the sense-amp enable signal SEN through a gate terminal.

The sense-amp 600 is activated when the sense-amp enable signal SEN goes to a high level, such that it compares the sensing voltage SAI with the reference voltage VREF and amplifies the compared result.

The data output unit 700 includes a plurality of PMOS transistors P4 and P5, a plurality of NMOS transistors N8 and N9, a latch R1, and an inverter IV3.

In this case, the PMOS transistors P4 and P5 and the NMOS transistors N8 and N9 input are serially connected between the peri-voltage (VPERI) input terminal and the ground voltage terminal. The PMOS transistor P4 and the NMOS transistor N9 are configured to receive the sensing data SOb from the sense-amp 600 through a common gate terminal.

The PMOS transistor P5 is configured to receive a control signal ONb through a gate terminal, and the NMOS transistor N8 is configured to receive a control signal ON through a gate terminal. The control signal ONb is an inverting signal of the control signal.

The latch R1 includes inverters IV1 and IV2, output signals of which are used as input signals. That is, the output signal of the inverter IV1 is input to the inverter IV2, and the output signal of the inverter IV2 is input to the inverter IV1. The inverter IV3 inverts the output signal of the latch R1 such that it outputs the output signal OUT.

In accordance with the embodiment of the present invention, the clamping precharge unit 530 for the clamping operation of the bit line is maintained without any change, and a precharge operation timing for the sensing operation is controlled by the timing controller 450, such that the conventional precharge unit structure is not required.

That is, the non-volatile memory device performs the precharge operation prior to the sensing operation so as to form the data sensing condition during the read operation as well as to implement the same initial condition. In this case, in order to reduce current consumption, the precharge operation is divided into two stages such that the two-stage precharge operations are carried out.

During the primary precharge operation, the clamping precharge unit 530 is operated in response to the clamping precharge signal CLMPRE, such that the node SIO is precharged with the peri-voltage (VPERI) level. Generally, during the secondary precharge operation, the precharge unit 12 is operated in response to the precharge signal SAIPRE, such that the sensing voltage SAI is precharged with a high voltage (VPPSA) level.

However, an embodiment of the present invention need not include the precharge unit 12 for the secondary precharge operation. The timing controller 450 controls the turn-on or turn-off timing point of the drive unit 510 used for providing the sensing current, resulting in a reduction of the sense-amp area.

For this operation, the present embodiment turns on the drive unit 510 at an activation time of the word line WL. That is, the drive unit 510 is turned on during an initial period in which the current-voltage converter 500 starts to be enabled.

Accordingly, during the initial period in which the current-voltage converter 500 is operated, the current driving transistor P1 is turned on in response to the current driving signal SAILD, such that the drive unit 510 is operated and the precharge operation is performed.

Figure 8:
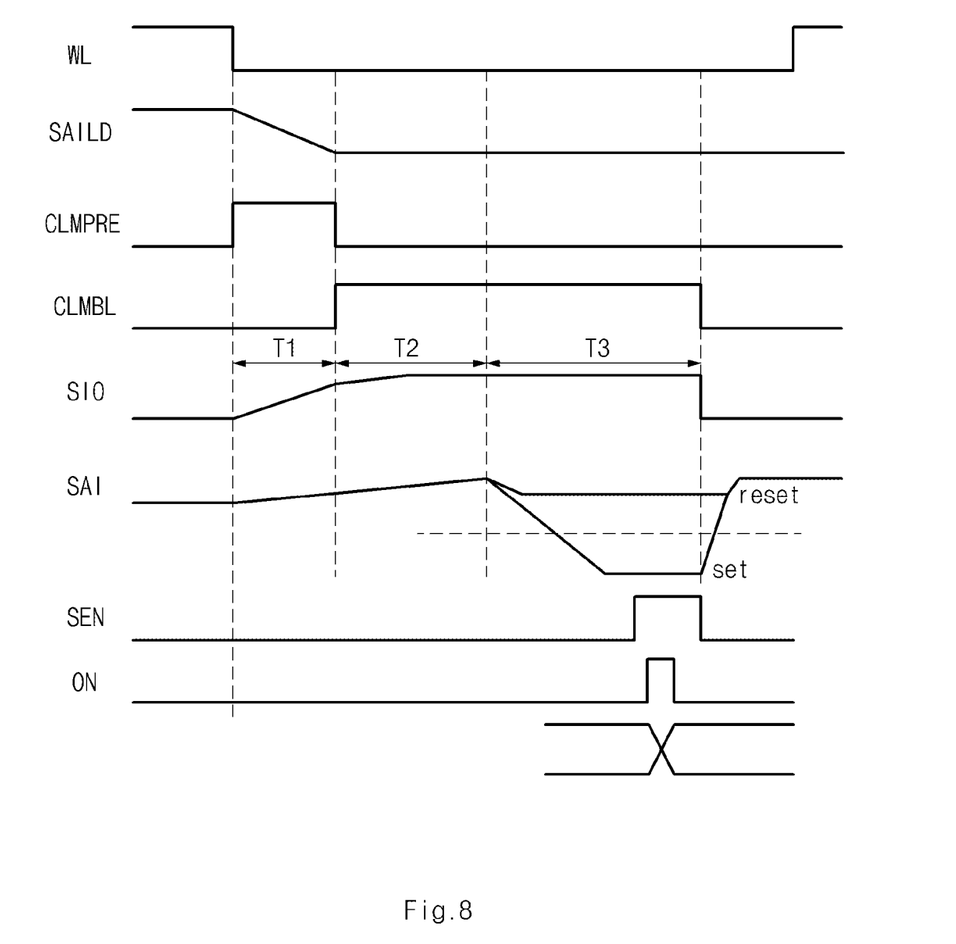
FIG. 8 is an operation timing diagram illustrating operations of the non-volatile memory device shown in FIG. 7.

FIG. 8 is an operation timing diagram illustrating operations of the non-volatile memory device shown in FIG. 7. The operations of the non-volatile memory device according to the present embodiment will hereinafter be described with reference to the operation timing diagram of FIG. 8.

During the period before the T1 period, the word line WL is maintained at a high level. In addition, if the current driving signal SAILD goes to a high level, the drive unit 510 is turned off such that the sensing voltage SAI is at a low voltage level.

If the clamping precharge signal CLMPRE is at a low level, the clamping precharge unit 530 is turned off such that the node SIO goes to a low voltage level.

Thereafter, if a current time enters the T1 period, the word line WL goes to a low level in response to the output signal of the word line driver 200. For example, the word line driver 200 is first driven at a high level indicating a deactivation state of the word line WL and then goes to a low level indicating an activation state of the word line WL at a T1 time point.

Thus, the sensing current controller 451 or the precharge controller 452 outputs a high voltage level. Accordingly, the current driving signal SAILD indicating the output signal of the combination unit 454 goes to a low level.

In more detail, during the T1 period, the word line driver 200 drives the word line WL at a low level, and the sensing voltage SAI is driven at a high voltage (VPPSA) level by the sensing current controller 451 or the precharge controller 452, thus preparing for the sensing operation.

If the current driving signal SAILD is at a low level, the drive unit 510 is turned on. Therefore, during the T1 period acting as the primary precharge period, the sensing voltage (SAI) level is increased.

In this implementation, if the clamping precharge signal CLMPRE goes to a high level during the T1 period, the clamping precharge unit 530 is turned on such that a voltage level of the node SIO is increased.

Subsequently, if the clamping control signal CLMBL goes to a high level at the beginning of the T2 period, the clamping unit 520 is turned on such that a voltage level of the node SIO is further increased. Then, if the clamping unit 520 is turned on, the sensing voltage (SAI) level is further increased, and the sensing voltage SAI is clamped in response to the voltage of the node SIO.

The reason why there is a time spacing between the T1 time point and the T2 time point is that a predetermined time is consumed for the drive unit 510 to be driven at the high voltage VPPSA, such that the clamping unit 520 controls the operation timing point in consideration of the lapse of time. The clamping unit 520 controls the timing point for transmission of the driven high voltage VPPSA, such that the current-voltage converter 500 can more correctly perform the sensing operation.

Subsequently, if a current time enters the T3 period, the data developing operation is carried out. That is, if a primary precharge operation is performed in the T1 period and the secondary precharge operation is performed in the T2 period, the sensing voltage SAI reaches the sensing threshold voltage level.

Therefore, the sense-amp enable signal SEN is activated in the T3 period, such that the sensing operation is carried out. In this case, if the control signal ON is activated to a high level, data is output through the data output unit 700.

If the sensing operation starts at the T3 period, a predetermined voltage is derived at both ends of a non-volatile memory device (for example, a PCR element) contained in the unit cell UC. The sensing voltage (SAI) begins to be changed in response to a resistance difference of cell data. Such resistance difference is referred to as a sensing margin. If the sensing voltage SAI is not changed in a sufficient-sized range, that is, if enough sensing margin is not established, it is impossible for the sense-amp 600 to correctly discriminate data.

Subsequently, after lapse of the T3 period, if the clamping control signal CLMBL goes to a low level, the sensing operation is ended.

Figure 9:
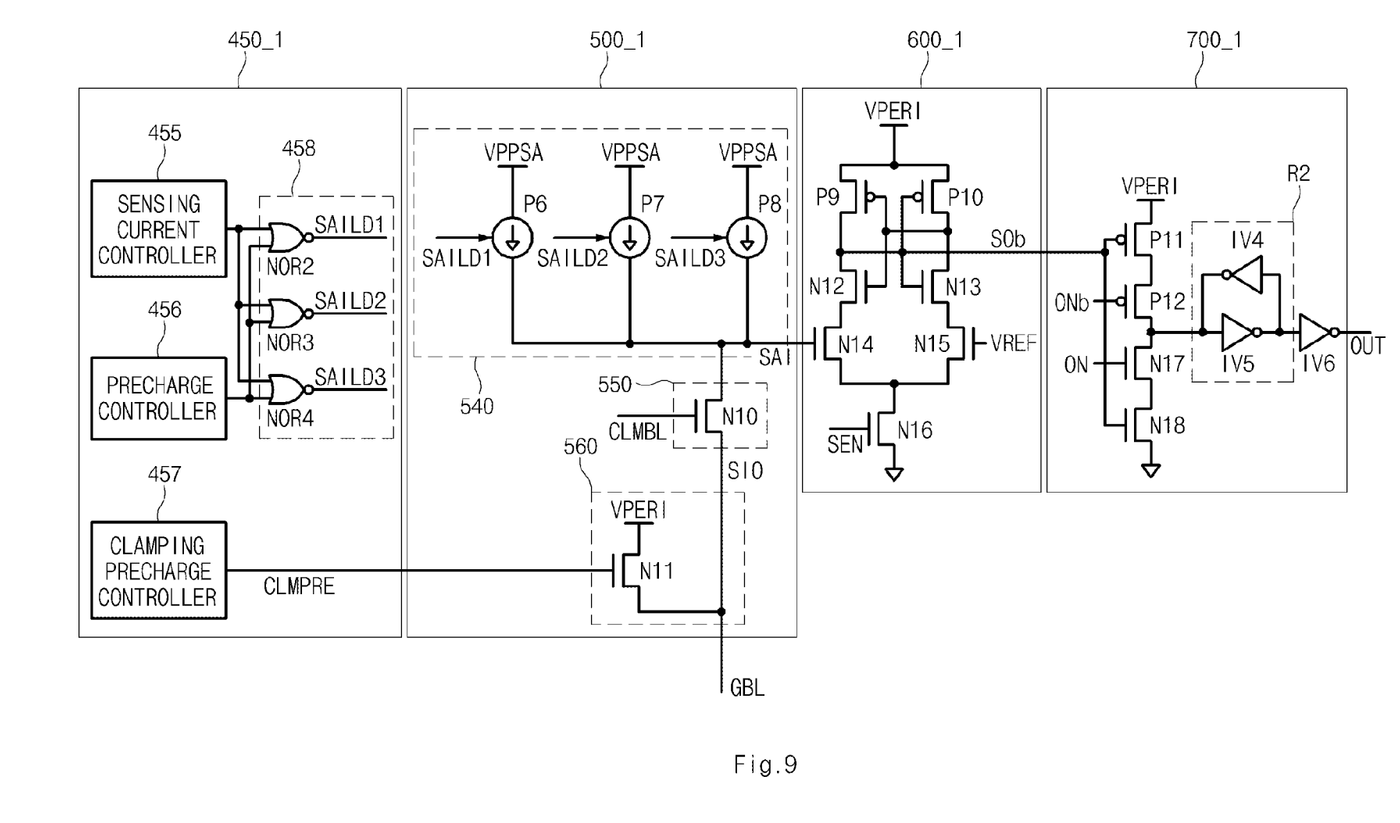
FIG. 9 is a circuit diagram illustrating a non-volatile memory device according to another embodiment of the present invention.

FIG. 9 is a circuit diagram illustrating a non-volatile memory device according to another embodiment of the present invention.

Referring to FIG. 9, a timing controller 450_1 includes a sensing current controller 455, a precharge controller 456, a clamping precharge controller 457, and a combination unit 458.

Herein, the sensing controller 455 may control the sensing current flowing in the current-voltage converter 500_1.

The precharge controller 456 may control the activation timing of the current driving signals SAILD1~SAILD3 during the precharge operation. For example, the precharge controller 456 activates the current driving signals SAILD1~SAILD3 to a low level when the word line WL is activated to a low level.

The precharge controller 456 maintains an activation state (i.e., a low level) of one current driving signal (for example, a current driving signal SAILD3) sensed by the actual sensing operation. The remaining current driving signals (e.g., current driving signals SAILD1 and SAILD2) other than one current driving signal (e.g., a current driving signal SAILD3) are deactivated to a high level.

The clamping precharge controller 457 controls the activation timing of the clamping precharge signal CLMPRE during the precharge operation. For example, the clamping precharge controller 457 activates the clamping precharge signal CLMPRE to a high level when the word line WL is activated to a low level.

In addition, the combination unit 458 logically combines the output signal of the sensing current controller 455 and the output signal of the precharge controller 456. If at least one of the output signal of the sensing current controller 455 and the output signal of the precharge controller 456 is activated to a high level, the combination unit 458 outputs the low-level current driving signals SAILD1~SAILD3.

In this implementation, the combination unit 458 includes NOR gates NOR2~NOR4 that perform a NOR operation with the output signal of the sensing current controller 455 and the output signal of the precharge controller 456 so as to output the current driving signals SAILD1~SAILD3.

The current-voltage converter 500_1 includes a drive unit 540, a clamping unit 550, and a clamping precharge unit 560.

The drive unit 540 drives the high voltage VPPSA in response to the current driving signals SAILD1~SAILD3, such that it outputs the sensing voltage SAI. The drive unit 540 includes current driving transistors P6~P8 that are connected between the high voltage (VPPSA) input terminal and the sensing voltage (SAI) output terminal so as to receive the current driving signals SAILD1~SAILD3 through gate terminals of the transistors P6~P8.

In this implementation, the current driving transistors P6~P8 may be implemented as PMOS transistors. The driving unit 540 adjusts the sensing current flowing in the PMOS transistors P6~P8 in response to the current driving signals SAILD1~SAILD3, such that it controls the sensing voltage SAI.

During the sensing operation, low-level current driving signals SAILD1~SAILD3 are input to the drive unit 540. In other operations excluding the sensing operation, high-level current driving signals SAILD1~SAILD3 are input to the drive unit 540. Activation and deactivation timing points of such current driving signals SAILD1~SAILD3 are selectively controlled in response to the output signals of the sensing current controller 455 and the precharge controller 456.

If a diode-type switching element is used in the unit cell (UC), a high voltage is required for the read operation due to a high threshold voltage of the diode. For this operation, the current-voltage converter 500_1 is configured to use a high voltage VPPSA higher than a peri-voltage VPERI used in the read operation. The peri-voltage VPERI has a voltage level used in a general peripheral circuit. The peri-voltage VPERI is set to a general external voltage level. Therefore, the sensing voltage SAI is driven at a high voltage (VPPSA) level higher than the peri-voltage (VPERI) level.

In addition, during the sensing operation, the clamping unit 550 clamps a voltage level of the sensing voltage SAI received from the global bit line GBL in response to the clamping control signal CLMBL. The clamping unit 550 includes an NMOS transistor N10 that is connected between the sensing output (SAI) output terminal and the node SIO so as to receive the clamping control signal CLMBL through a gate terminal.

For example, during the sensing operation, if a high-level clamping control signal CLMBL is input to the clamping unit 550, the NMOS transistor N10 is turned on such that the clamping unit 550 clamps the sensing voltage SAI received from the global bit line GBL. Conversely, if no sensing operation is performed and a low-level clamping control signal CLMBL is input to the clamping unit 550, the NMOS transistor N10 is turned off such that the clamping unit 550 does not output the sensing voltage SAI.

The clamping precharge unit 560 may precharge the node SIO with the peri-voltage (VPERI) level in response to the clamping precharge signal CLMPRE. In this case, the clamping precharge unit 560 includes an NMOS transistor N11 that is connected between the peri-voltage (VPERI) input terminal and the node SIO so as to receive the clamping precharge signal CLMPRE through a gate terminal.

In addition, the sense-amp 600_1 includes PMOS transistors P9 and P10 and NMOS transistors N12~N16. In this implementation, the PMOS transistors P9 and P10 and the NMOS transistors N12 and N13 are cross-coupled to one another, and are driven at the peri-voltage (VPERI) level.

The sensing voltage SAI is input to a gate terminal of the NMOS transistor N14, and the reference voltage VREF is input to a gate terminal of the NMOS transistor N15. The sense-amp 600_1 compares the sensing voltage SAI with the reference voltage VREF, and amplifies the compared result. The NMOS transistor N16 is connected between a common source terminal of the NMOS transistors N14 and N15 and a ground voltage terminal, such that it receives the sense-amp enable signal SEN through a gate terminal.

The sense-amp 600_1 is activated when the sense-amp enable signal SEN goes to a high level, such that it compares the sensing voltage SAI with the reference voltage VREF and amplifies the compared result.

The data output unit 700_1 includes a plurality of PMOS transistors P11 and P12, a plurality of NMOS transistors N17 and N18, a latch R2, and an inverter IV4.

In this case, the PMOS transistors P11 and P12 and the NMOS transistors N17 and N18 are serially connected between the peri-voltage (VPERI) input terminal and the ground voltage terminal. The PMOS transistor P11 and the NMOS transistor N18 are configured to receive the sensing data SOb from the sense-amp 600_1 through a common gate terminal.

The PMOS transistor P12 is configured to receive a control signal ONb through a gate terminal, and the NMOS transistor N17 is configured to receive a control signal ON through a gate terminal. The control signal ONb is an inverting signal of the control signal.

The latch R2 includes inverters IV4 and IV5, output signals of which are used as input signals. That is, the output signal of the inverter IV4 is input to the inverter IV5, and the output signal of the inverter IV5 is input to the inverter IV4. The inverter IV6 inverts the output signal of the latch R2 such that it outputs the output signal OUT.

Figure 10:
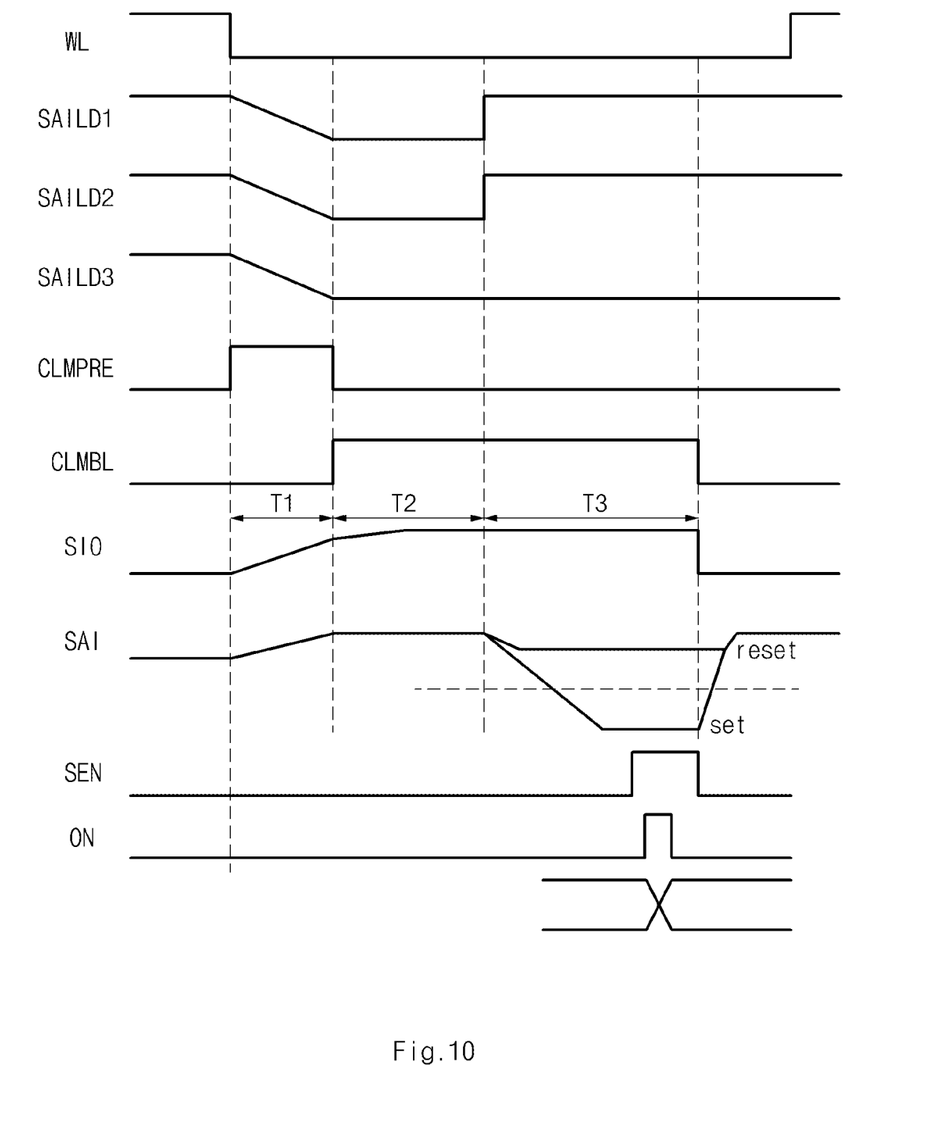
FIG. 10 is an operation timing diagram illustrating operations of the non-volatile memory device shown in FIG. 9.

FIG. 10 is an operation timing diagram illustrating operations of the non-volatile memory device shown in FIG. 9. The operations of the non-volatile memory device according to the embodiment of the present invention will hereinafter be described with reference to the operation timing diagram of FIG. 10.

During the period located prior to the T1 period, the word line WL is maintained at a high level. In addition, if the current driving signals SAILD1~SAILD3 go to a high level, the drive unit 540 is turned off such that the sensing voltage SAI is at a low voltage level.

If the clamping precharge signal CLMPRE is at a low level, the clamping precharge unit 560 is turned off such that the node SIO goes to a low voltage level.

Thereafter, if the current time enters the T1 period, the word line WL goes to a low level in response to the output signal of the word line driver 200. For example, the word line driver 200 is first driven at a high level indicating a deactivation state of the word line WL and then goes to a low level indicating an activation state of the word line WL at a T1 time point.

Thus, the sensing current controller 455 or the precharge controller 456 outputs a high voltage level. Accordingly, the current driving signals SAILD1~SAILD3 indicating the output signals of the combination unit 458 go to a low level.

In more detail, during the T1 period, the word line driver 200 drives the word line WL at a low level, the sensing voltage SAI is driven at a high voltage (VPPSA) level by the sensing current controller 455 or the precharge controller 456, thus preparing for the sensing operation.

If the current driving signals SAILD1~SAILD3 are at a low level, the PMOS transistors P6~P8 of the drive unit 540 are turned on. Therefore, during the T1 period acting as the primary precharge period, the sensing voltage (SAI) level is increased. In this case, the PMOS transistors P6~P8 of the drive unit 540 of the drive unit 540 are turned on, such that the sensing voltage (SAI) level is relatively quickly increased as compared to that of FIG. 8.

In this implementation, if the clamping precharge signal CLMPRE goes to a high level during the T1 period, the clamping precharge unit 560 is turned on such that a voltage level of the node SIO is increased.

Subsequently, when the clamping control signal CLMBL goes to a high level at the beginning of the T2 period, the clamping unit 550 is turned on such that a voltage level of the node SIO is further increased. Then, if the clamping unit 550 is turned on, the sensing voltage (SAI) level is further increased, and the sensing voltage SAI is clamped in response to the voltage of the node SIO.

The reason why there is a time spacing between the T1 time point and the T2 time point is that a predetermined time is consumed for the drive unit 540 to be driven at the high voltage VPPSA, such that the clamping unit 550 controls the operation timing point in consideration of the lapse of time. The clamping unit 550 controls the timing point for transmission of the driven high voltage VPPSA, such that the current-voltage converter 500_1 can more correctly perform the sensing operation.

Subsequently, if a current time enters the T3 period, the data developing operation is carried out. That is, if a primary precharge operation is performed in the T1 period and the secondary precharge operation is performed in the T2 period, the sensing voltage SAI reaches the sensing threshold voltage level.

Therefore, the sense-amp enable signal SEN is activated in the T3 period, such that the sensing operation is carried out. In this case, if the control signal ON is activated to a high level, data is output through the data output unit 700.

If the sensing operation starts at the T3 period, a predetermined voltage is derived at both ends of a non-volatile memory device (for example, a PCR element) contained in the unit cell UC. The sensing voltage (SAI) begins to be changed in response to a resistance difference of cell data. Such resistance difference is referred to as a sensing margin. If the sensing voltage SAI is not changed in a sufficient-sized range, that is, if enough sensing margin is not established, it is impossible for the sense-amp 600_1 to correctly discriminate data.

In the T3 period, only one current driving signal SAILD3 required for the sensing operation is substantially maintained at a low level. In contrast, the remaining current driving signals SAILD1 and SAILD2 are deactivated to a high level.

Subsequently, after lapse of the T3 period, if the clamping control signal CLMBL goes to a low level, the sensing operation is ended.

The embodiment shown in FIG. 9 or 10 includes a plurality of sensing current driving transistors P6~P8 for a normal read operation and a verification read operation.

Therefore, during the T1 and T2 precharge operations, all the current driving PMOS transistors P6~P8 are turned on. If a current time enters the T3 period in which the sensing operation is performed, only the PMOS transistor P8 required for the normal read operation is turned on, and the remaining transistors P6 and P7 are turned off.

As is apparent from the above description, the above-mentioned exemplary embodiments of the present invention have the following characteristics. The non-volatile memory device according to embodiments of the present invention, during the non-volatile memory reading operation in which the non-volatile memory device senses a variation of current changing with cell resistance and amplifies the sensed result to a voltage level, adjusts timing of a precharge operation used for the sensing, resulting in a reduction in the sense-amp array.

Those skilled in the art will appreciate that the present invention may be carried out in other specific ways than those set forth herein without departing from the spirit and essential characteristics of the present invention. The above exemplary embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an exemplary embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A non-volatile memory device comprising:
   a cell array including one or more unit cells, configured to read or write data;
   a current-voltage converter configured to convert a sensing current corresponding to data stored in the unit cell into a sensing voltage, and to precharge the sensing voltage upon receiving the sensing current in response to a current driving signal at an activation time point of a word line of the cell array;
   a sense-amp configured to compare the sensing voltage with a predetermined reference voltage, and to amplify the compared result; and
   a timing controller configured to activate the current driving signal when the word line is activated, and output the activated signal.

2. The non-volatile memory device according to claim 1, wherein the timing controller includes:
   a sensing current controller configured to control an activation timing point of the current driving signal;
   a precharge controller configured to control an activation timing point of the precharge operation; and
   a combination unit configured to combine an output signal of the sensing current controller and an output signal of the precharge controller, and output the current driving signal.

3. The non-volatile memory device according to claim 2, wherein the combination unit is configured to activate the current driving signal to a low level when at least one of the output signal of the sensing current controller and the output signal of the precharge controller is activated, and to output the resultant low-level current driving signal.

4. The non-volatile memory device according to claim 1, wherein the current-voltage converter includes:
   a clamping unit configured to clamp the sensing voltage in response to a clamping control signal;
   a drive unit configured to provide the sensing current in response to the current driving signal; and
   a clamping precharge unit configured to precharge a bit line in response to a clamping precharge signal.

5. The non-volatile memory device according to claim 4, wherein the drive unit includes a current driving transistor configured to precharge the sensing voltage with a high voltage when the current driving signal is activated.

6. The non-volatile memory device according to claim 5, wherein the current driving transistor is turned on in response to the current driving signal at an activation timing point of the clamping precharge signal.

7. A non-volatile memory device comprising:
   a cell array including one or more unit cells, configured to read or write data;
   a current-voltage converter configured to convert a sensing current corresponding to data stored in the unit cell into a sensing voltage, and to precharge the sensing voltage upon receiving the sensing current in response to a plurality of current driving signals at an activation time point of a word line of the cell array;
   a sense-amp configured to compare the sensing voltage with a predetermined reference voltage, and to amplify the compared signal; and
   a timing controller configured to selectively activate the plurality of current driving signals when the word line is activated, and output the activated signals.

8. The non-volatile memory device according to claim 7, wherein the timing controller includes:
   a sensing current controller configured to selectively control activation timing points of the plurality of the current driving signals;
   a precharge controller configured to control an activation timing point of the precharge operation; and
   a combination unit configured to combine an output signal of the sensing current controller and an output signal of the precharge controller, and output the plurality of current driving signals.

9. The non-volatile memory device according to claim 8, wherein the combination unit is configured to activate the plurality of current driving signals to a low level when at least one of the output signal of the sensing current controller and the output signal of the precharge controller is activated, and to output the resultant low-level current driving signals.

10. The non-volatile memory device according to claim 7, wherein the current-voltage converter includes:
    a clamping unit configured to clamp the sensing voltage in response to a clamping control signal;
    a drive unit configured to selectively provide the sensing current in response to the plurality of current driving signals; and
    a clamping precharge unit configured to precharge a bit line in response to a clamping precharge signal.

11. The non-volatile memory device according to claim 10, wherein the drive unit includes a plurality of current driving transistors that are selectively turned on in response to the plurality of current driving signals.

12. The non-volatile memory device according to claim 11, wherein the plurality of current driving transistors are turned on in response to the plurality of current driving signals at an activation timing point of the clamping precharge signal.

13. The non-volatile memory device according to claim 11, wherein only one current driving transistor of the drive unit is activated during a sensing operation.

14. The non-volatile memory device according to claim 11, wherein the plurality of current driving transistors includes:
    a normal current driving transistor configured to be turned on during a sensing operation; and
    a verification current driving transistor configured to be turned on during a verification operation.

* * * * *